United States Patent
Cho

(10) Patent No.: US 7,037,778 B2
(45) Date of Patent: May 2, 2006

(54) METHOD FOR FABRICATING CAPACITOR IN SEMICONDUCTOR MEMORY DEVICE

(75) Inventor: Yong-Tae Cho, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 11/018,181

(22) Filed: Dec. 20, 2004

(65) Prior Publication Data

US 2006/0003539 A1    Jan. 5, 2006

(30) Foreign Application Priority Data

Jun. 30, 2004    (KR) .................. 10-2004-0049857

(51) Int. Cl.
*H01L 21/8242*    (2006.01)

(52) U.S. Cl. .................................... 438/253

(58) Field of Classification Search ........ 438/238–244, 438/250, 253–256, 386–387, 391, 393, 396–400, 438/403–405, 424–426, 597, 600, 618, 622, 438/624, 634, 637, 658, 663, 795
See application file for complete search history.

(56) References Cited

U.S. PATENT DOCUMENTS

| 6,667,209 B1 * | 12/2003 | Won et al. | 438/253 |
| 6,716,679 B1 * | 4/2004 | Bae | 438/132 |
| 6,800,522 B1 * | 10/2004 | Lee | 438/253 |

* cited by examiner

*Primary Examiner*—Michael Lebentritt
*Assistant Examiner*—Andre Stevenson
(74) *Attorney, Agent, or Firm*—Townsend and Townsend and Crew LLP

(57) ABSTRACT

Disclosed is a method for fabricating a capacitor in a semiconductor memory device. The method includes the steps of: sequentially forming a first insulation layer and a first etch stop layer on a substrate; forming a plurality of contact holes by etching the first insulation layer and the first etch stop layer; forming a plurality of contact plugs on the plurality of contact holes such that the contact plugs are more projected than the first etch stop layer; sequentially forming a second etch stop layer and a capacitor insulation layer; forming a plurality of openings by etching the second etch stop layer and the capacitor insulation layer to expose the contact plugs; sequentially forming a storage node material and a sacrificial layer; etching the storage node material and the sacrificial layer, thereby obtaining isolated storage node material; and removing remaining portions of the sacrificial layer and the capacitor insulation layer.

15 Claims, 6 Drawing Sheets

METHOD FOR FABRICATING CAPACITOR IN SEMICONDUCTOR MEMORY DEVICE

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

1. Field of the Invention

The present invention relates to a method for fabricating a capacitor in a semiconductor memory device; and more particularly, to a method for fabricating a cylinder type capacitor capable of preventing a damage in a bottom structure disposed beneath the capacitor by forming a plurality of storage node contact plugs in a well type.

2. Description of Related Arts

As for a capacitor of a semiconductor memory device, both an outer wall and an inner wall of a cylinder type lower electrode function as electrodes. Accordingly, it is possible to improve a capacitance by increasing a surface area of the capacitor.

FIGS. 1A to 1D are cross-sectional views illustrating a conventional method for fabricating a capacitor in a semiconductor memory device.

Referring to FIG. 1A, an inter-layer insulation layer 110 is formed on a silicon substrate 100, and a plurality of storage node contact plugs 120 are formed on corresponding storage node contacts 115 formed by etching the inter-layer insulation layers 110. An etch stop layer 130 and a capacitor insulation layer 135 are formed on the above resulting substrate structure and then, predetermined portions of the etch stop layer 130 and the capacitor insulation layer 135 corresponding to the plurality of contact plugs 120 are etched, thereby forming a plurality of openings 140 for storage nodes. Herein, the capacitor insulation layer 135 is an oxide-based layer.

Referring to FIG. 1B, a storage node material 150 such as titanium nitride (TiN) and a sacrificial layer 160 are sequentially deposited on openings 140.

Referring to FIG. 1C, the storage node material 150 and the sacrificial layer 160 are subjected to a plasma blanket etch-back process and as a result, a plurality of storage nodes 155 are isolated. After a process for isolating the plurality of storage nodes 155, the sacrificial layer 160 is removed.

Referring to FIG. 1D, the plurality of cylinder type storage nodes 155 are formed by removing the capacitor insulation layer 135 with use of a chemical such as hydrofluoric acid (HF) or buffered oxide etchant (BOE). Subsequently, a dielectric layer 170 and a plate node 180 are formed.

However, in the course of forming the capacitor, there is a misalignment between the plurality of storage nodes which are lower electrodes and the plurality of storage node contact plugs. Accordingly, when the lower electrodes are formed by using a metal such as TiN and then, are dipped into the chemical such as HF or BOE to remove the capacitor insulation layer under a state that the misalignment is generated between the plurality of storage nodes and the plurality of storage node contact plugs, the TiN layer which is the lower electrode cannot properly serve a role as a blocking layer.

This result is because there generates a crack in the TiN layer during the step of controlling contents of titanium chloride ($TiCl_2$) within the TiN layer.

Accordingly, during the dipping process for removing the capacitor insulation layer, a chemical path is created at the crack of the TiN layer and thus, the chemical such as HF or BOE is penetrated through the chemical path created by the misalignment between the plurality of storage nodes and the plurality of storage nodes contact plugs. Accordingly, because of the penetrated chemical, the plurality of storage node contact plugs or the oxide layer which is the inter-layer insulation layer is susceptibly damaged, thereby inducing various defects such as a single and dual bit failure, and a direct current (DC) failure, which further causes decrease in yields of semiconductor devices and a poor operation

BRIEF SUMMARY OF THE INVENTION

It is, therefore, an object of the present invention to provide a method for fabricating a capacitor in a semiconductor memory device capable of preventing a damage in a bottom structure disposed beneath the capacitor by forming a plurality of storage node contact plugs in a well type.

In accordance with one aspect of the present invention, there is provided a method for fabricating a capacitor in a semiconductor memory device, including the steps of: sequentially forming a first insulation layer and a first etch stop layer on a substrate; forming a plurality of contact holes by etching the first insulation layer and the first etch stop layer; forming a plurality of contact plugs on the plurality of contact holes such that the contact plugs are more projected than the first etch stop layer; sequentially forming a second etch stop layer and a capacitor insulation layer; forming a plurality of openings by etching the second etch stop layer and the capacitor insulation layer to expose the contact plugs; sequentially forming a storage node material and a sacrificial layer; etching the storage node material and the sacrificial layer, thereby obtaining isolated storage node material; and removing remaining portions of the sacrificial layer and the capacitor insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

FIGS. 2A to 2H are cross-sectional views illustrating a method for fabricating a capacitor in a semiconductor memory device in accordance with the present invention.

Figure 1A:
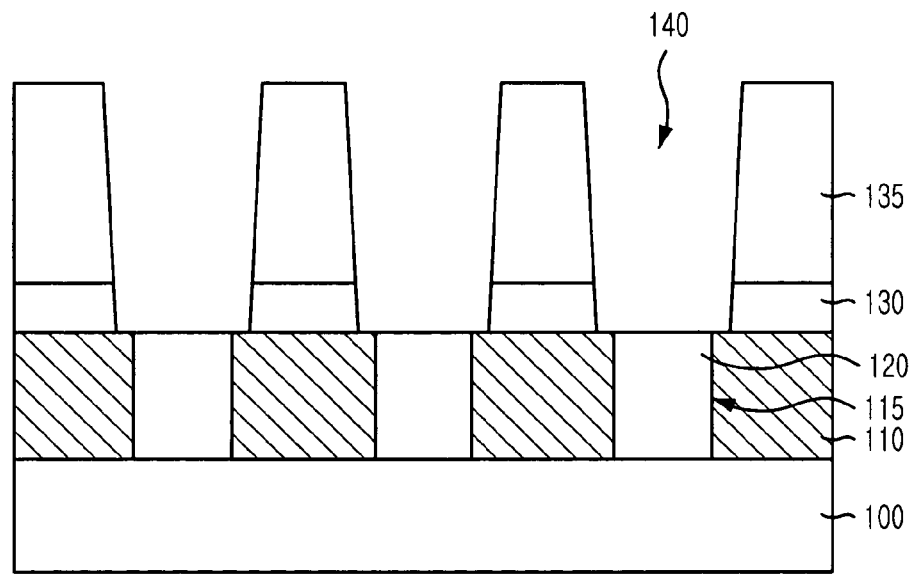
FIGS. 1A to 1D are cross-sectional views illustrating a conventional method for fabricating a capacitor in a semiconductor memory device.
Figure 1B:
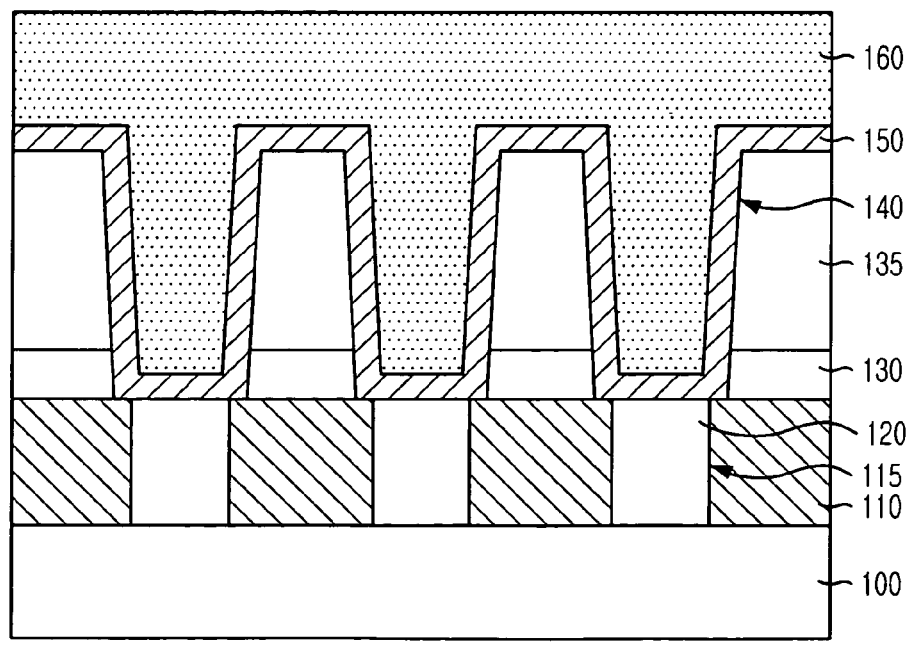
Figure 1C:
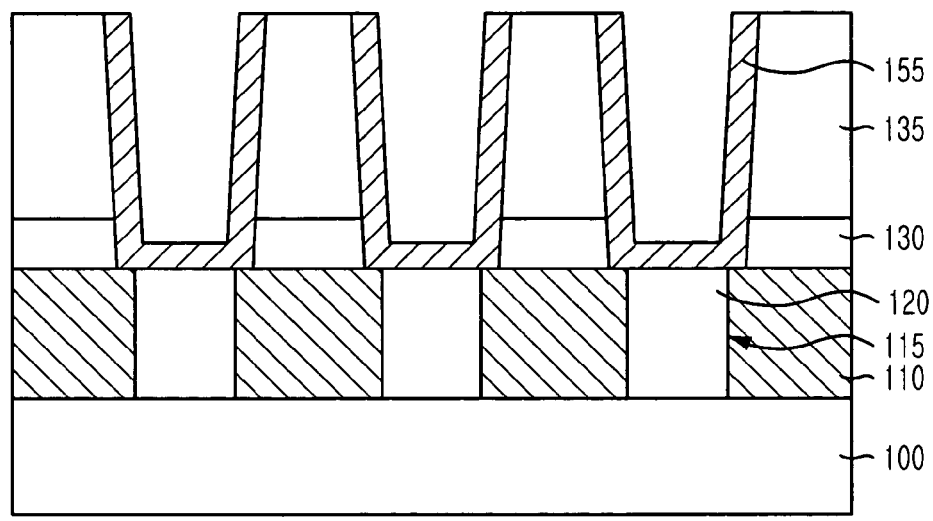
Figure 1D:
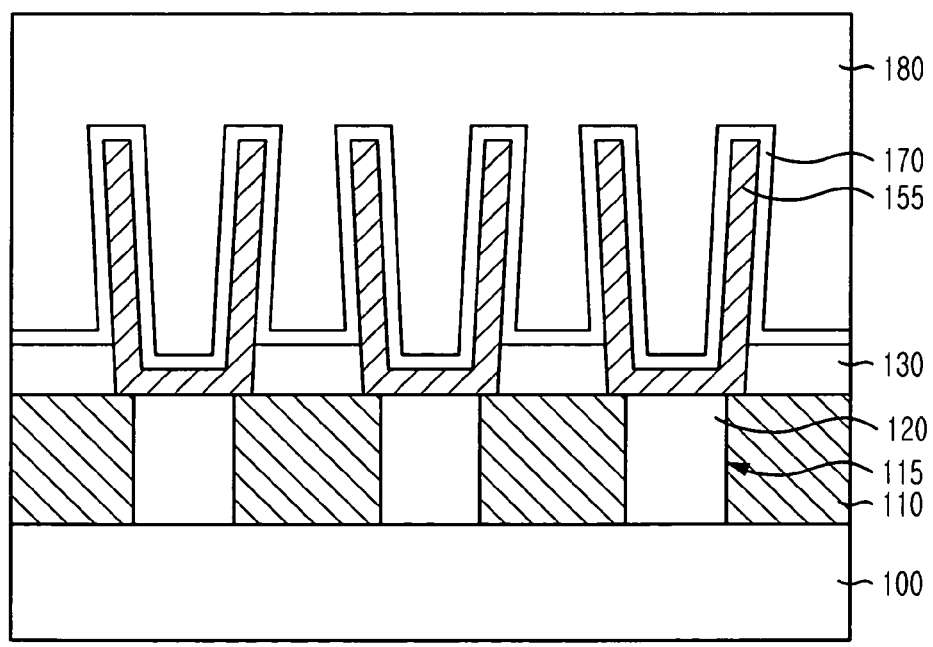
Figure 2A:
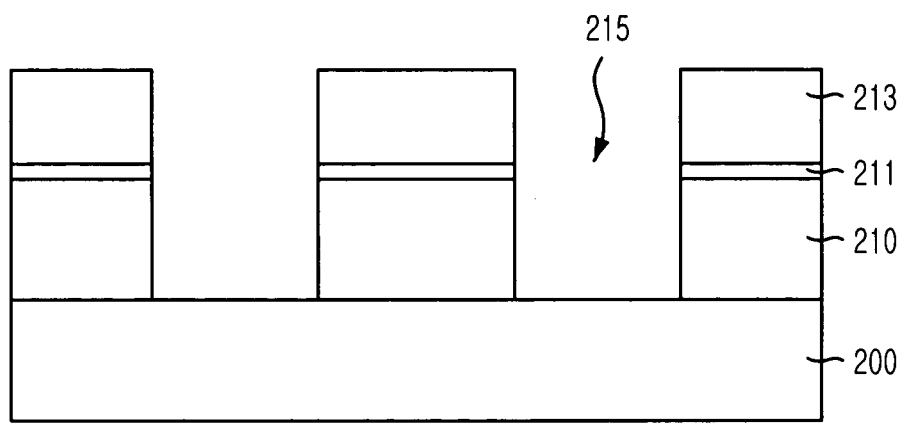
FIGS. 2A to 2H are cross-sectional views illustrating a method for fabricating a capacitor in a semiconductor memory device in accordance with the present invention.
Figure 2B:
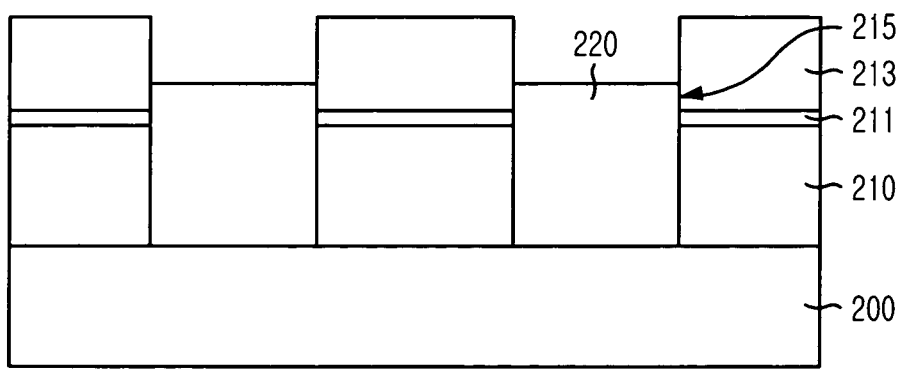

Referring to FIG. 2A, an inter-layer insulation layer 210 is deposited on a silicon substrate 200 and then, a first etch stop layer 211 and an insulation layer 213 for forming a plurality of storage node contact holes 215 are sequentially formed thereon. The first etch stop layer 211 is made of nitride and is deposited in a thickness ranging from approximately 100 Å to approximately 300 Å. The insulation layer 213 is made of a material having a high etch ratio that allows the insulation layer 213 to be easily removed by using a chemical. Oxide is one example of such material. Also, the insulation layer 213 is deposited in a thickness ranging from approximately 500 Å to approximately 1,000 Å.

Subsequently, although not illustrated, a photo-sensitive layer is deposited on the insulation layer 213 and then, the photo-sensitive layer is patterned such that the photo-sensitive layer placed in which the plurality of storage node contact holes 215 will be formed is removed, thereby exposing the insulation layer 213. The exposed insulation layer 213, the first etch stop layer 211 and the inter-layer insulation layer 210 are etched by using the photo-sensitive layer, thereby forming the aforementioned plurality of storage node contact holes 215.

At this time, a multi layer formed by stacking the inter-layer insulation layer 210, the first etch stop layer 211 and the insulation layer 213 are etched in a ratio of approximately 2 to 3 of $C_xHF_x$ to 1 of $C_xF_x$ which are high density plasmas of a magnetically enhanced reactive ion etching (MERIE) type. That is, the multi-layer is etched by inducing a lot of CHx radicals by using a $CH_xF_x$ plasma, e.g., a $CHF_3$ plasma and a $CH_2F_2$ plasma, along with use of $CH_4$ as a main gas. During etching the multi-layer, one of plasma etchers selected from a group of an in-plane switching (IPS), an inductively coupled plasma (ICP), a transformer coupled plasma (TCP) and an electron cyclotron resonance (ECR) plasma etchers is used.

Reaction mechanisms of $C_xF_x$ gas used for etching the multi-layer are provided below. Herein, the first provided reaction of each $C_xF_x$ gas is a reaction when each $C_xF_x$ gas reacts with an oxide layer and the second provided reaction of each $C_xF_x$ gas is a reaction when each $C_xF_x$ gas reacts with a nitride layer.

CF: $SiO_2 + 4CF \rightarrow SiF_4 + 2CO\uparrow + 2C$ $Si_3N_4 + 12CF \rightarrow 3SiF_4 + 2NF_3 + 12C$ CF2: $SiO_2 + 2CF_2 \rightarrow SiF_4 + 2CO\uparrow$ $Si_3N_4 + 12CF_2 \rightarrow 3SiF_4 + 4NF_3 + 12C$ CF3: $3SiO_2 + 4CF_3 \rightarrow 3SiF_4 + 4O_2 + 4OC\uparrow$ $Si_3N_4 + 8CF_3 + 8O_2 \rightarrow 3SiF_4 + 4NF_3 + 8CO\uparrow$ Referring to FIG. 2B, a polysilicon layer for use in a storage node contact plug is formed on the above obtained substrate structure and then, one of an etch-back process and a chemical mechanical polishing (CMP) process used for a typical plug isolation process is performed, thereby forming a plurality of storage node contact plugs 220 within the plurality of storage node contact holes 215.

At this time, the etch back process is performed by mixing hydrogen bromide (HBr) and chlorine ($Cl_2$) under a state of providing a source voltage equal to or greater than approximately 300 W and a bias voltage equal to or less than approximately 100 W at a pressure equal to or less than approximately 10 mT by using a typical TCP type plasma source. Also, the etch-back process continues until the storage node contact plugs 220 have thicknesses from the first etch stop layer 211 in a range from approximately 300 Å to approximately 500 Å.

At this time, although not shown, a barrier layer such as TiSi2 can be formed in order to increase adhesiveness between the plurality of storage node contact plugs 220 made of polysilicon and lower electrodes made of TiN which will be formed in a subsequent process.

Figure 2C:
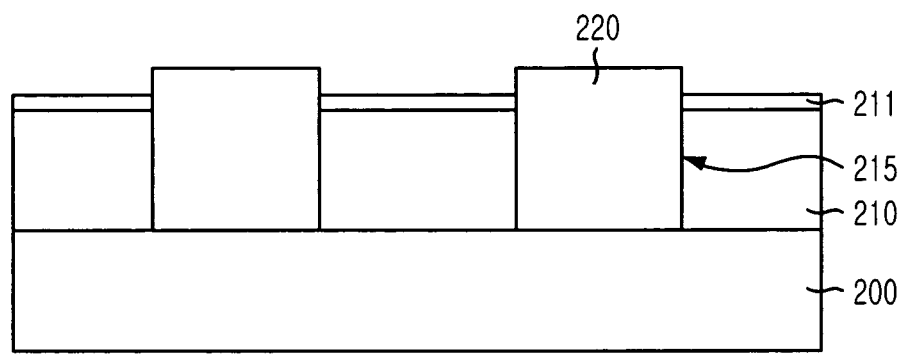

Referring to FIG. 2C, the insulation layer 213 is removed by using a wet etching process with use of one of hydrogen fluoride acid (HF) and buffered oxide etchant (BOE), so that the plurality of storage node contact plugs 220 are formed in well type.

Figure 2D:
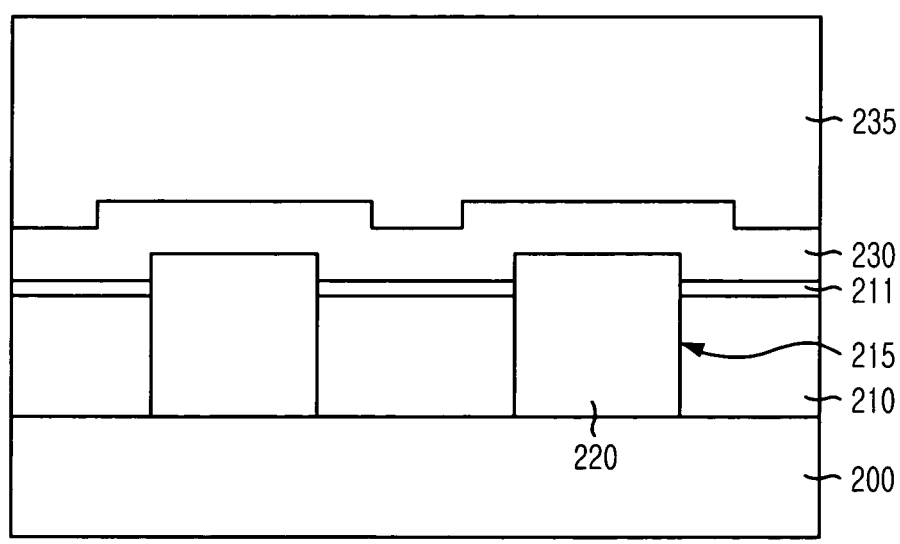

Referring to FIG. 2D, a second etch stop layer 230 for forming a storage node is formed on the above substrate structure and a capacitor insulation layer 235 made of oxide is deposited thereon. The second etch stop layer 230 is formed by depositing a nitride layer. In accordance with the present invention, the plurality of storage node contact plugs 220 are formed to be more projected than the first etch stop layer 211 and thus, the second etch stop layer 230 is also formed to have a difference in height. Accordingly, the first etch stop layer 211 formed on lateral sides of the plurality of storage node contact plugs 220 and the second etch stop layer 230 are margins for misalignment generated during a subsequent process for forming a plurality of storage nodes.

Figure 2E:
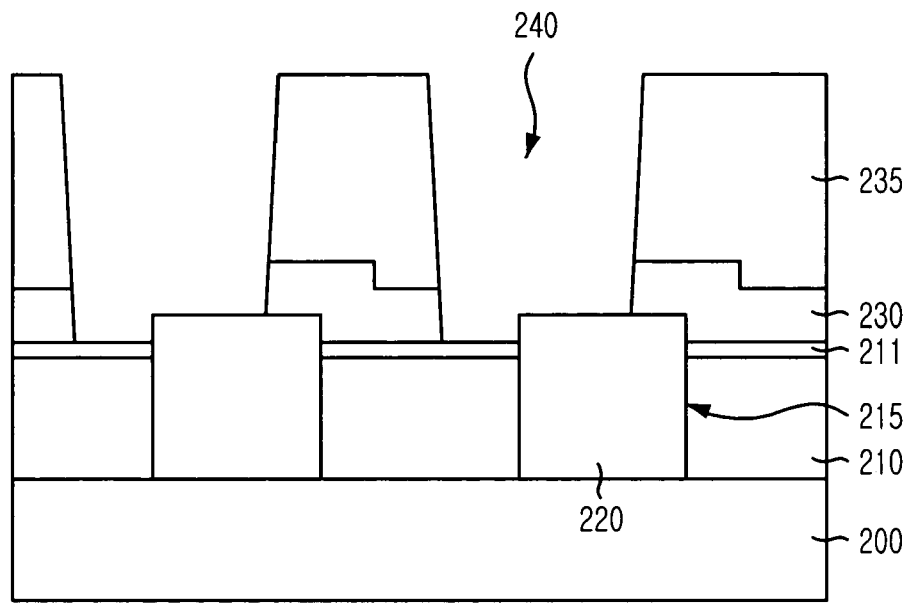

Referring to FIG. 2E, the capacitor insulation layer 235 and the second etch stop layer 230 are etched, thereby forming a plurality of openings 240 for the storage nodes.

At this time, as shown in FIG. 2E, even though a misalignment is happened, a contact area between each two of the storage node contact plugs increases because not only upper portions of the plurality of storage node contact plugs 220 and the first etch stop layer 211 made of nitride but also lateral portions of the storage node contact plugs 220 are exposed by the openings 240.

Figure 2F:
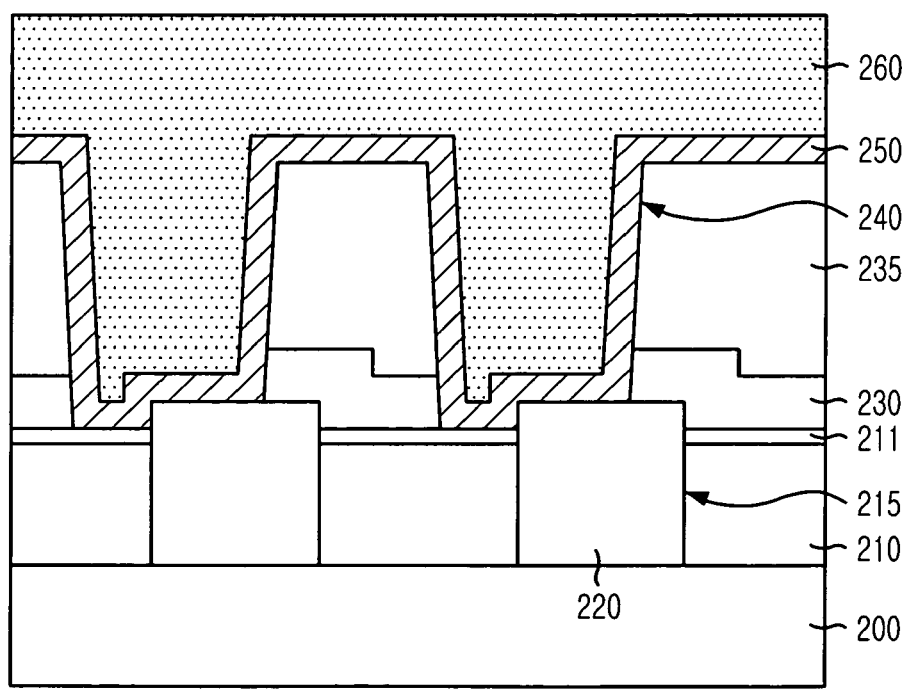

Referring to FIG. 2F, a storage node material 250 such as TiN is deposited and then, a sacrificial layer 260 is deposited thereon.

Figure 2G:
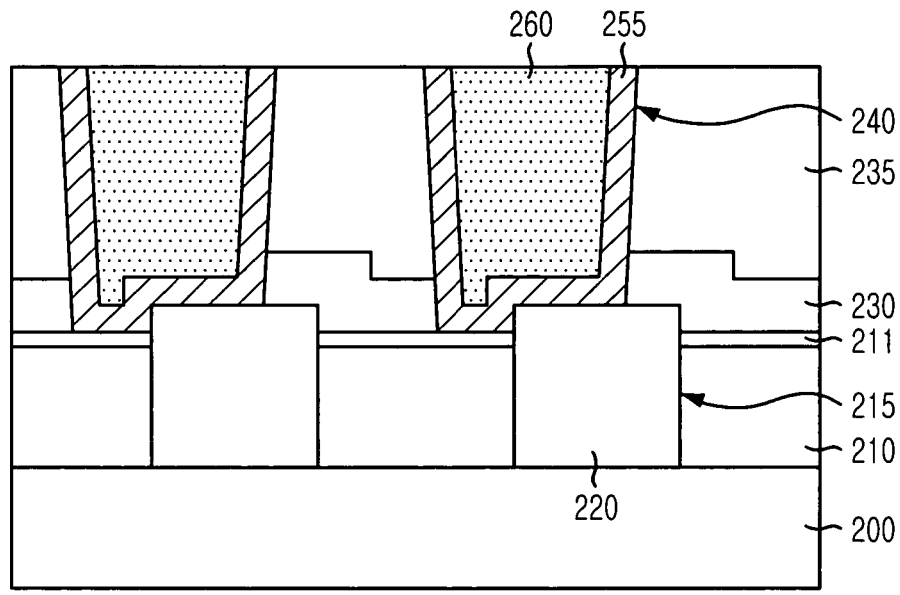

Referring to FIG. 2G, an etch back process or a CMP process is applied to the storage node electrode material 250 and the sacrificial layer 260 to thereby obtain isolated storage nodes 255.

Figure 2H:
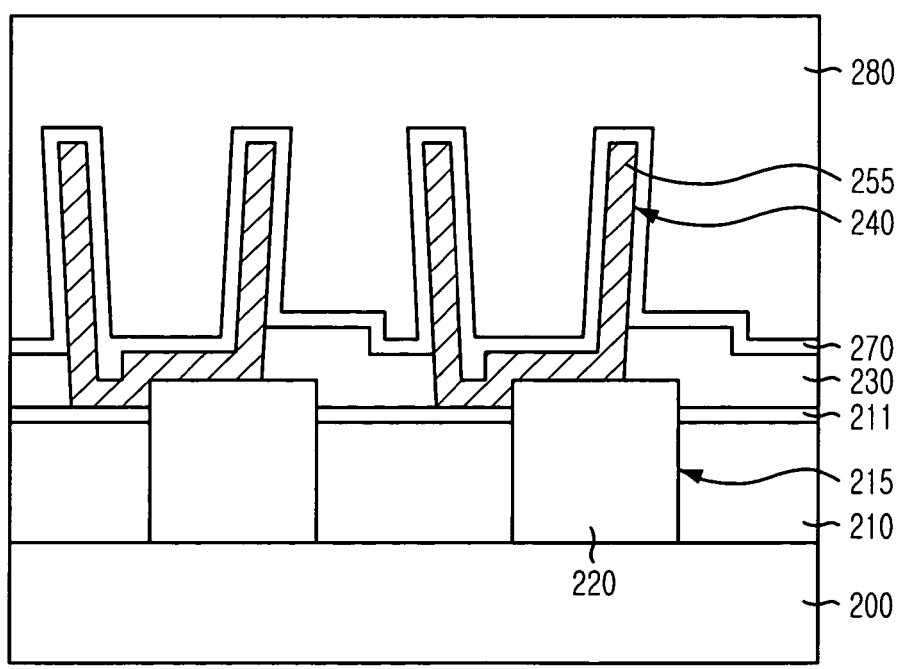

Referring to FIG. 2H, the sacrificial layer 260 is removed and then, the capacitor insulation layer 235 is removed by performing a wet etching process using one of HF and BOE, thereby forming the complete storage nodes 255, i.e., lower electrodes. At this time, even though the misalignment is generated between each two of the storage nodes 255 and the storage node contact plugs 220, since the well-type storage node contact plugs 220 allow the first and the second etch stop layers 211 and 230 to be disposed on each lateral side of the plurality of storage node contact plugs 220, the storage nodes 255 are contacted with not only upper portions but also lateral portions of the plurality of contact plugs 220 and surrounded by the first and the second etch stop layers 211 and 230 at a region in which the misalignment is generated.

Accordingly, during the wet etching process for removing the capacitor insulation layer 235, diffusion of the wet chemical through cracks formed in the lower electrodes 255, i.e., the TiN layer, is intercepted, and as a result, it is possible to prevent a bottom structure disposed beneath the lower electrodes 255 from being damaged. Because of the blocked penetration of the wet chemical, it is further possible to prevent generation of defects such as a single and dual bit failure and a direct current (DC) failure.

The method for fabricating a capacitor in accordance with the present invention forms a plurality of storage node plugs in a well type and etch stop layer made of nitride layers on lateral sides of the plurality of contact plugs in order to protect a bottom structure disposed beneath storage nodes from damages usually caused by a penetrated wet chemical in the course of forming the storage nodes. Accordingly, the present invention improves a property of a semiconductor device and increases yields of semiconductor devices.

The present application contains subject matter related to the Korean patent application No. KR 2004-0049857, filed in the Korean Patent Office on Jun. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor in a semiconductor memory device, comprising the steps of:
    forming a first insulation layer over a substrate;
    forming a first etch stop over the first insulation layer, the first etch stop layer having an upper surface;
    forming a plurality of contact holes by etching the first insulation layer and the first etch stop layer;
    forming a plurality of contact plugs on the plurality of contact holes, each contact plug having an upper portion that extends above the upper surface of the first etch stop layer;
    forming a second etch stop layer over the contact plugs and the first etch stop layer, the second etch stop layer being substantially non-planar;
    forming a capacitor insulation layer over the second etch stop layer;
    forming a plurality of openings by etching the second etch stop layer and the capacitor insulation layer to expose the contact plugs;
    sequentially forming a storage node material and a sacrificial layer;
    etching the storage node material and the sacrificial layer, thereby obtaining isolated storage node material; and
    removing remaining portions of the sacrificial layer and the capacitor insulation layer.

2. The method of claim 1, wherein the first etch stop layer is formed in a thickness ranging from approximately 300Å to approximately 500 Å.

3. The method of claim 1, wherein each of the upper portions of the contact plugs extends above the upper surface of the first etch stop layer from approximately 300 Å to approximately 500 Å.

4. The method of claim 1, wherein the step of forming the plurality of contact holes includes:
    forming a second insulation layer on the first etch stop layer;
    etching the first insulation layer, the first etch stop layer and the second insulation layer, thereby obtaining the plurality of contact holes; and
    removing the second insulation layer.

5. The method of claim 4, wherein the first insulation layer, the first etch stop layer and the second insulation layer are etched by using high density plasmas having a ratio of approximately 2 to 3 of $C_XHF_X$ to approximately 1 of $C_XF_X$.

6. The method of claim 5, wherein the first insulation layer, the first etch stop layer and the second insulation layer are etched by using one of plasma etchers selected from a group of an in-plane switching (IPS) etcher, an inductively coupled plasma (ICP) etcher, a transformer coupled plasma (TCP) etcher and an electron cyclotron resonance (ECR) etcher.

7. The method of claim 1, wherein the step of forming the plurality of contact plugs includes the steps:
    forming a polysilicon layer on the contact holes; and
    etching the polysilicon layer through performing one of an etch-back process and a chemical mechanical polishing (CMP) process.

8. The method of claim 7, wherein the etch-back process is performed by using hydrogen bromide (HBr) and chlorine ($Cl_2$) in combination under a state of providing a source voltage equal to or greater than approximately 300 W and a bias voltage equal to or less than approximately 100 W at a pressure equal to or less than approximately 10 mT by using a typical transformer coupled plasma (TCP) type plasma source.

9. The method of claim 1, further including the step of forming a dielectric layer and a plate node material on the substrate.

10. The method of claim 1, wherein the contact holes and the contact plugs are storage node contact holes and storage node contact plugs, respectively.

11. A method for fabricating a capacitor in a semiconductor memory device, the method comprising:
    forming a first insulation layer over a substrate;
    forming a first etch stop over the first insulation layer, the first etch stop layer having an upper surface;
    forming a contact hole by etching the first insulation layer and the first etch stop layer; and
    forming a contact plug within the plurality of contact hole, the contact plug having an upper portion that extends above the upper surface of the first etch stop layer; the upper portion of the contact plug and the upper surface of the first etch stop layer defining a non-uniform surface; and
    forming a storage node structure over the contact plug.

12. The method of claim 11, further comprising:
    forming a dielectric layer over the over the contact plugs and the first etch stop layer, the second etch stop layer being substantially non-planar.

13. The method of claim 12, wherein the dielectric layer is a second etch stop layer.

14. The method of claim 13, further comprising:
    forming a capacitor insulation layer over the second etch stop layer;
    forming a plurality of openings by etching the second etch stop layer and the capacitor insulation layer to expose the contact plugs;
    forming a sacrificial layer over the storage node structure;
    etching the storage node material and the sacrificial layer to obtain an isolated storage node structure; and
    removing remaining portions of the sacrificial layer and the capacitor insulation layer.

15. A method for fabricating a capacitor in a semiconductor memory device, comprising the steps of:
    sequentially forming a first insulation layer and a first etch stop layer on a substrate;

forming a plurality of contact holes by etching the first insulation layer and the first etch stop layer;

forming a plurality of contact plugs on the plurality of contact holes such that the contact plugs are more projected than the first etch stop layer;

sequentially forming a second etch stop layer and a capacitor insulation layer;

forming a plurality of openings by etching the second etch stop layer and the capacitor insulation layer to expose the contact plugs;

sequentially forming a storage node material and a sacrificial layer;

etching the storage node material and the sacrificial layer, thereby obtaining isolated storage node material; and removing remaining portions of the sacrificial layer and the capacitor insulation layer, wherein the step of forming the plurality of contact plugs includes the steps:

forming a polysilicon layer on the contact holes; and etching the polysilicon layer through performing one of an etch-back process and a chemical mechanical polishing (CMP) process; and wherein the etch-back process is performed by using hydrogen bromide (HBr) and chlorine ($Cl_2$) in combination under a state of providing a source voltage equal to or greater than approximately 300 W and a bias voltage equal to or less than approximately 100 W at a pressure equal to or less than approximately 10 mT by using a typical transformer coupled plasma (TCP) type plasma source.

* * * * *